United States Patent
Zoels et al.

(10) Patent No.: US 9,634,657 B1
(45) Date of Patent: Apr. 25, 2017

(54) SYSTEM AND METHOD FOR OVERCURRENT PROTECTION FOR A FIELD CONTROLLED SWITCH

(71) Applicant: GENERAL ELECTRIC COMPANY, Schenectady, NY (US)

(72) Inventors: Thomas Alois Zoels, Hebertshausen (DE); Alvaro Jorge Mari Curbelo, Oberschleissheim (DE); Miguel Garcia Clemente, Munich (DE)

(73) Assignee: General Electric Company, Niskauyuna, NY (US)

( * ) Notice: Subject to any disclaimer, the term of this patent is extended or adjusted under 35 U.S.C. 154(b) by 0 days.

(21) Appl. No.: 14/956,165

(22) Filed: Dec. 1, 2015

(51) Int. Cl.
*H03K 17/08* (2006.01)
*H03K 17/081* (2006.01)
*H03K 17/567* (2006.01)

(52) U.S. Cl.
CPC ..... *H03K 17/08116* (2013.01); *H03K 17/567* (2013.01)

(58) Field of Classification Search
CPC ............. H03K 17/0828; H03K 17/567; H03K 17/122; H03K 17/14; H03K 17/168; H03K 17/18; H03K 17/08122
USPC ........ 327/109, 333, 404, 434; 363/132, 123, 363/126, 21.14
See application file for complete search history.

(56) References Cited

U.S. PATENT DOCUMENTS

| 4,721,869 A | 1/1988 | Okado |
| 6,275,093 B1 | 8/2001 | Shekhawat et al. |
| 7,724,065 B2 | 5/2010 | Bayerer et al. |
| 7,760,478 B2 | 7/2010 | Yang et al. |
| 8,503,146 B1 | 8/2013 | Shekhawat |
| 8,723,590 B2 | 5/2014 | Curbelo et al. |
| 8,823,354 B2 | 9/2014 | Gan et al. |
| 2012/0188001 A1* | 7/2012 | Mizobe .................. H02P 29/02 327/427 |

FOREIGN PATENT DOCUMENTS

| CN | 203014660 U | 6/2013 |
| WO | 20140154221 A2 | 10/2014 |

OTHER PUBLICATIONS

Seki, Y. et al; "A new IGBT with a monolithic over-current protection circuit;" Proceedings of the 6th International Symposium on Power Semiconductor Devices and ICs, May 1994.

* cited by examiner

*Primary Examiner* — John Poos
(74) *Attorney, Agent, or Firm* — Joseph J. Christian

(57) ABSTRACT

A method includes detecting current from a first terminal of the switch to a second terminal of the switch, wherein the current exceeds a current limit for a linear region of the switch. The method includes controlling a gate voltage of the switch from a first voltage to a second voltage. The second voltage is configured to enable the switch to operate in an active region of the switch. The method further includes opening the switch when the switch is operating in the active region.

18 Claims, 5 Drawing Sheets under standard rated operations, such as several hundreds or several thousands of volts in high power applications. Operation in the linear region may occur during normal operation of the switch. Furthermore, the switch may operate in the active region when the switch opens or closes.

SYSTEM AND METHOD FOR OVERCURRENT PROTECTION FOR A FIELD CONTROLLED SWITCH

TECHNICAL FIELD

The subject matter disclosed herein relates to protecting field controlled or gate controlled switches, and, more particularly, to protecting a switch in the event of an overcurrent.

BACKGROUND

Power electronics frequently include switches that open and/or close electrical circuits and interrupt and/or allow the flow of current. Electronic switches, such as insulated-gate bipolar transistors (IGBTs), metal-oxide-semiconductor field-effect transistors (MOSFETs), or the like, are frequently used in power electronics to control the current that can flow across the switch. Several types of these electronic switches are frequently opened or closed depending on the application of a voltage on a gate terminal of that switch ($V_{GE}$). Typically, when the gate voltage of the switch, with respect to another terminal of the switch (source or emitter) reaches a threshold, the switch starts to close and allows current to flow between the power terminals of the switch which can be referenced as collector and emitter or drain and source.

However, many switches are designed to operate with a limited amount of current. While switches can often be designed to withstand higher currents, the components of the switch may be larger or have higher costs. Further, it is still possible that an unanticipated short circuit or fault may occur. Since the switch can be damaged due to overheating and/or stress if current limits of the switch are exceeded, it may be beneficial to protect switches from exceeding such current limits and/or to protect switches in case an overcurrent condition arises.

SUMMARY

In a first embodiment, a method includes detecting current from a first terminal of the switch to a second terminal of the switch, wherein the current exceeds a current limit for a linear region of the switch, controlling a gate voltage of the switch from a first voltage to a second voltage, wherein the second voltage is configured to enable the switch to operate in an active region of the switch, and opening the switch when the switch is operating in the active region.

In a second embodiment, a system includes a gate drive unit configured to detect current from a first terminal of a switch to a second terminal of the switch, wherein the current exceeds a current limit for a linear region of the switch, control a gate voltage of the switch from a first voltage to a second voltage, wherein the second voltage is configured to enable the switch to operate in an active region of the switch, and open the switch when the switch is operating in active region.

In a third embodiment, a system includes a switch, a controller configured to transmit one or more drive signals to the switch, wherein the drive signals are configured to control the switch, and a gate drive unit configured to provide a gate voltage, a gate current, or a combination thereof for controlling the switch based on the drive signals, wherein the gate drive unit is configured to detect current from a first terminal of the switch to a second terminal of the switch, wherein the current exceeds a current limit for a linear region of the switch, control a gate voltage of the switch from a first voltage to a second voltage, wherein the second voltage is configured to enable the switch to operate in an active region of the switch, and open the switch when the switch is operating in the active region.

BRIEF DESCRIPTION OF THE DRAWINGS

These and other features and aspects of the disclosure are provided with reference to the accompanying drawings in which like characters represent like parts throughout the drawings, wherein.

DETAILED DESCRIPTION

Figure 1:
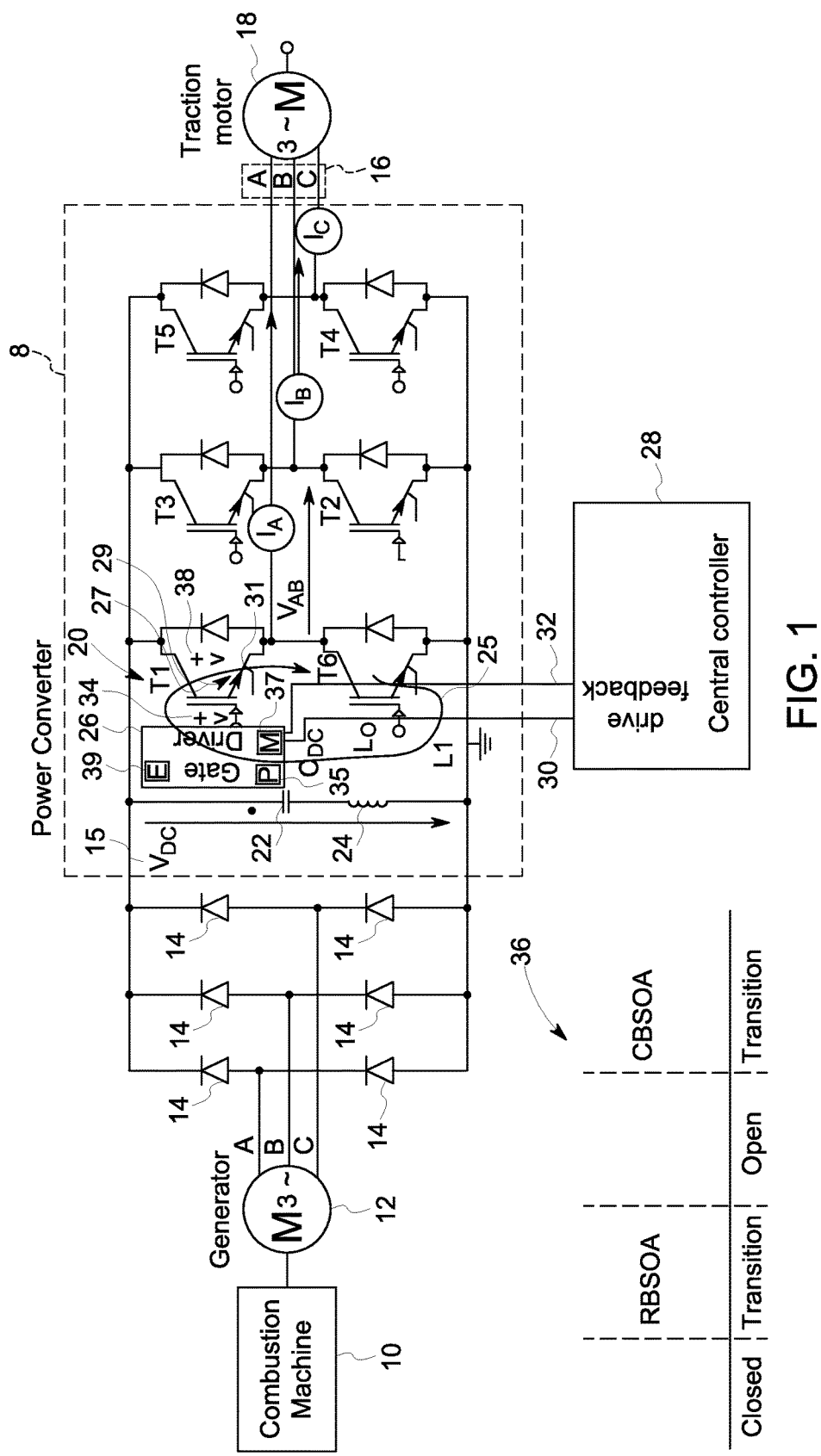
FIG. 1 is a schematic diagram of an embodiment of a power converter showing at one position a gate drive unit for an insulated-gate bipolar transistor (IGBT)

The subject matter disclosed herein relates to protecting power switches, and, more particularly, to protecting switches when currents exceed operating limits.

Switches, such as insulated-gate bipolar transistors (IGBTs) and metal-oxide-semiconductor field-effect transistors (MOSFETs), are used in a wide variety of applications and industries. For example, power converters, such as traction converters, may convert power from direct current (DC) to alternating current (AC) or change voltages. Power converters can typically include one or more switches that open or close depending on a gate voltage provided to a gate of the switch by a gate drive unit. The gate drive unit may operate based on signals received from a controller that controls the switches to provide AC power.

The normal operation of the switch may include opening and closing of the switch to enable or disable flow of current through the switch. For instance, current may flow from one power terminal (e.g., collector) of the switch to another terminal (e.g., emitter) when the switch is closed. However, failures may occur during operation of the power converter that can cause high levels (e.g., above designed maximums) of current conducted through parts of the power converter, such as the one or more switches. Unfortunately, if the switch opens while conducting current that exceeds current limitations of the switch, the switch has an increased likelihood of breaking down due to the excess current, voltage, or power through the switch. The excess current, voltage, or power may cause overheating or generation of an electric field that the switch is not designed to withstand.

The switch may operate in a linear region or an active region depending on the gate voltage of the switch and/or current through the switch. When operating in the linear region, the voltage across the first terminal and second terminal of the switch is typically in the range of several hundred millivolts to several volts. When operating in the active region, the voltage across the first terminal and second terminal of the switch may increase up to the operation voltage of the power converter which is typically in the range of hundreds of volts and the switch may limit the current conducted while in a closed state. During normal operation, the switch may operate in the linear region associated with a linear increase in voltage as current increases. As current through the switch increases or the gate voltage decreases, the switch may operate in an active region.

The switch may have two or more operating limits for combination of current flow from one power terminal of the switch to the other terminal and/or voltage across one power terminal of the switch to the other terminal, such as a reverse bias safe operating area (RBSOA) and a short circuit safe operating area (SCSOA) with one or more higher limits than the limits of the RBSOA. Before opening (e.g., before turn-off), the switch may operate in the active region or the linear region. The switch typically operates within RBSOA limits that apply during normal operation where the switch operates in the linear region while the switch is in closed state (e.g., before opening). The SCSOA limits apply when the switch operates in the active region while it is in closed state (e.g., before opening). If current through the switch exceeds the current limit of the RBSOA when operating in the linear region, there is an increased likelihood of damage to the switch from exceeding what the manufacturer designed the switch to withstand.

Typically, whether the switch operates in the linear region or the active region depends on the gate voltage of the switch. If the gate voltage is reduced, the switch can transition to operate in the active region. The gate drive unit may be configured to detect an overcurrent that exceeds a current limit of the RBSOA. Upon detecting this overcurrent condition while the switch is operating in the linear region, the gate drive unit may control the gate voltage to cause the switch to operate in the active region before the commanded turn-off to where the SCSOA applies. By controlling the switch to operate in the active region where higher operating limits apply, the switch can be safely opened.

Turning to the figures, FIG. 1 is an example of a traction converter 8 used in mining trucks (OHV) and locomotives. While a traction converter is used herein, it is merely an example, and any suitable application of the switch may be used. As shown in FIG. 1, a combustion machine 10 and a generator 12 are coupled to diodes 14 (e.g., diode bridge rectifier) that provide a DC voltage $V_{DC}$ output across a DC bus 15. The traction converter 8 utilizes the DC voltage $V_{DC}$ to provide three phase power 16 for a traction motor 18. That is, the traction converter 8 may include an inverter circuit with one or more switches 20, such as IGBTs, to convert the DC voltage $V_{DC}$ to three phase AC voltage 16. As an example, FIG. 1 shows a traction converter 8 that includes a DC-link capacitor ($C_{Dc}$) coupled to 6 IGBTs (switches 20) to provide a low loop inductance (e.g., 100 nH) for the commutation of current from one switch to another. The commutation process may take place between two switches 20 in the same leg (e.g., T1/T6, T3/T2, and T5/T4).

One or more switches 20 may be coupled to one or more gate drive units 26 that provide a driving voltage and/or current for opening or closing the switches 20 (e.g., turning the switches on or off). For example, as shown in FIG. 1, each switch 20 may be driven by to a gate drive unit 26, or a gate drive unit 26 may be used to drive multiple switches. The one or more gate drive units 26 may be coupled (e.g., electrically and/or communicably) to a controller 28 that controls opening or closing of the switches 20 to provide the three phase AC voltage 16. The controller 28 may transmit drive signals 30 (e.g., open or close signal) to the one or more gate drive units 26 and may receive feedback signals 32 from the gate drive units 26. Likewise, the one or more gate drive units 26 may receive drive signals 30 from the controller 28 and may transmit feedback signals 32 (e.g., OK/fault) to the controller 28. The controller 28 may receive and/or transmit signals related to DC voltages, phase voltages, phase currents, or other drive and feedback signals for other gate drive units. While any number of gate drive units 26 may be coupled to any number of switches 20, for the purposes of discussion, the present disclosure will refer to a gate drive unit 26 coupled to a switch 20.

In certain embodiments, the gate drive unit 26 may include various circuitry to perform the methods described herein, such as a level shifter and/or an amplifier. As an example, the gate drive unit 26 and/or the controller 28 may include a processor 35 or multiple processors, memory 37, and/or a field programmable gate array (FPGA) 39. The processor may be operatively coupled to the memory to execute instructions for carrying out the presently disclosed techniques, such as controlling operation of the switches 20 via the gate drive units 26. These instructions may be encoded in programs or code stored in a tangible non-transitory computer-readable medium, such as the memory and/or other storage. The processor may be a general purpose processor, system-on-chip (SoC) device, or application-specific integrated circuit, or some other processor configuration.

Memory 37, in the embodiment, may include a computer readable medium, such as, without limitation, a hard disk drive, a solid state drive, a diskette, a flash drive, a compact disc, a digital video disc, random access memory (RAM), firmware, read only memory (ROM, EPROM, flash memory, etc.) and/or any suitable storage device that enables processor to store, retrieve, and/or execute instructions (e.g., code) and/or data. Memory 37 may also include one or more local and/or remote storage devices.

Faults or failures in the traction converter 8 may occur for any number of reasons, and while some faults are described herein, these are merely examples. In many cases, failures may be divided into low inductance failures (e.g., up to 1 μH) that occur inside the power converter and high inductance failures (e.g., from 1 μH and up to the machine inductance level) that occur inside a load/machine (e.g., motor 18). As an example of low inductance, a lumped inductance $L_o$ 24 is depicted to include a loop inductance of a commutation loop 25. In contrast, the inductance of the motor windings of the traction motor 18 may be about 3 to 4 orders of magnitude larger than the lumped inductance $L_o$ 24. For example, if the controller 28 detects high change in current that exceeds one or more operating limits of the switch 20, the controller 28 may send an open command to the gate drive unit 26 to prevent damage from occurring to the switch 20. Due to high current during a high inductance failure, the controller 28 may send an open command when operating limits are exceeded. As these high currents can cause damage to the switch, it is desirable to protect the switch 20 during opening when currents exceed operating limits of the switches.

The commutation inductance seen by a leg in a given converter may be such that, if k is the allowable p.u. voltage overshoot above the DC link value $U_{DC}$, and if max($dI_{CE}/dt\_off$) is the maximum of the derivative of a current from a first terminal of the switch to a second terminal of the switch during turn-off of the switch, then the total commutation inductance should satisfy:

$$L_s \leq k * \frac{U_{DC}}{\max\left(\frac{dI_{CE}}{dt}\text{-off}\right)} \qquad \text{equation (1)}$$

As an example, if $U_{DC}$=800V and $U_{blocking}$=1200V (of a single switch), then k=(1200−800)/800=0.5. Then if max ($dI_{CE}$/dt_off)=12 kA/μs, then $L_S$≤33 nH. As an example, high inductance failures may include inductances larger than approximately 10×Ls, or 1 μH.

The switch 20 of the traction converter 8 may be controlled by a gate voltage 34 ($V_{GE}$). That is, depending on the gate voltage, the switch 20 may allow current to flow from a first power terminal 29 (e.g., collector) of the switch to a second power terminal 31 (e.g., emitter). For example, if the gate drive unit 26 closes the switch 20 by providing the appropriate gate voltage 34, current 27 may flow (e.g., between the collector and the emitter of the switch 20) in the circuit. As such, the controller 28 may send drive signals to the gate drive unit 26 to provide gate voltages 24 that open and close the switch 20 in a manner that outputs power desirable to operate the traction motor 18.

While the switch is opening, it is desirable to protect the switch 20 from exceeding the designed limitations of the switch 20. For example, FIG. 1 includes a diagram 36 that shows time periods where safe operating areas (SOAs) apply to operating parameters of the switch 20. As shown in diagram 36, a reverse bias safe operating area (RBSOA) may apply during a transition period from when the switch 20 is closed to when the switch is open. Further, a forward bias safe operating area (FBSOA) may apply during a transition period from when the switch is open to when the switch is closed.

Figure 2:
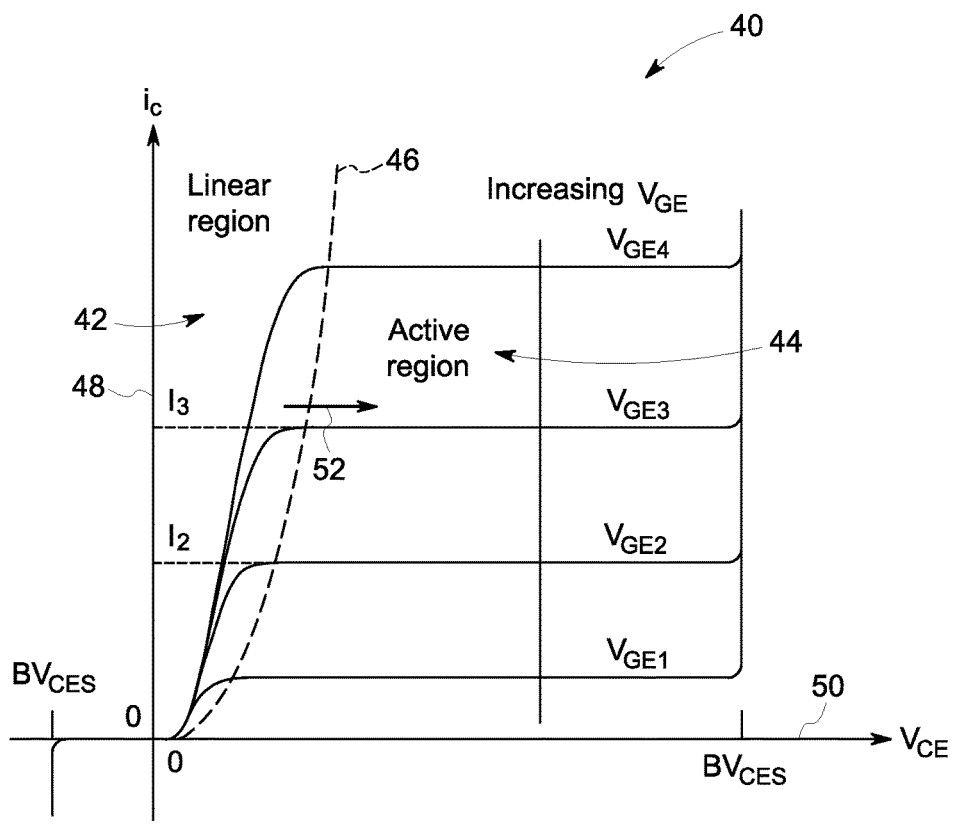
FIG. 2 is a graph illustrating an embodiment of output characteristics of the IGBT of FIG. 1.

The switch 20 may operate in a linear region or an active region depending on the gate voltage of the switch and/or the current through the switch. In the linear region, the switch may conduct increasing current in a closed state. In the active region, the switch may limit the current conducted while in a closed state. FIG. 2 shows a graph 40 with output characteristics of the switch 20. Typically, when the switch 20 is closed and the collector current 27 $I_C$ is in the normal operating range (e.g., not exceeding safe operating areas), the switch 20 operates in what is called the linear region 42 (e.g., when no fault or short circuit condition is present), or "in saturation". The linear region 42 is associated with an increasing voltage as the current through the switch 20 increases. If the current 27 through the switch 20 exceeds the linear region 42, the switch 20 operates in what is called the active region 44. The active region 44 is associated with a current limiting characteristic where current remains approximately constant and the voltage is unspecified. As indicated with reference number 46, the graph 40 shows how the collector current 27 $I_C$ on the y-axis 48 and collector-emitter voltage $V_{CE}$ on the x-axis 50 where the switch 20 transitions from the linear region 42 to the active region 44 varies based on the gate voltage 34 $V_{GE}$ (e.g., $I_3$ for $V_{GE3}$, $I_2$ for $V_{GE2}$). Typically, the gate drive unit 26 provides a gate voltage 34 that allows the IGBT to operate in the linear region 42 when closed (e.g., in an on state).

Transitioning from the linear region 42 to the active region 44 is called desaturation (e.g., indicated by reference number 52 when the gate voltage 34 $V_{GE}$=$V_{GE3}$). Based on the graph, for desaturation to occur on a switch 20, the current 27 may be increased and/or the gate voltage 34 may be decreased. By the switch 20 operating in the active region 44, the current 27 may be limited in the case of a fault or a short circuit failure and prevent damage. A short circuit condition is an event where the current flowing through the switch considered as ideal would be limited by external passive components of parasitic nature. Because the switch is not ideal (does not have 0 resistance) but has an active region, the switch is the one that ends up limiting the short circuit current when a short circuit condition is present. By decreasing the gate voltage 34, the current threshold level decreases for transitioning into the active region 44, thereby limiting the current 27. For example, if the gate drive unit 26 decreases the gate voltage 34 from $V_{GE3}$ to $V_{GE2}$, the collector current threshold for transitioning into the active region 44 decreases from $I_3$ to $I_2$.

Figure 3:
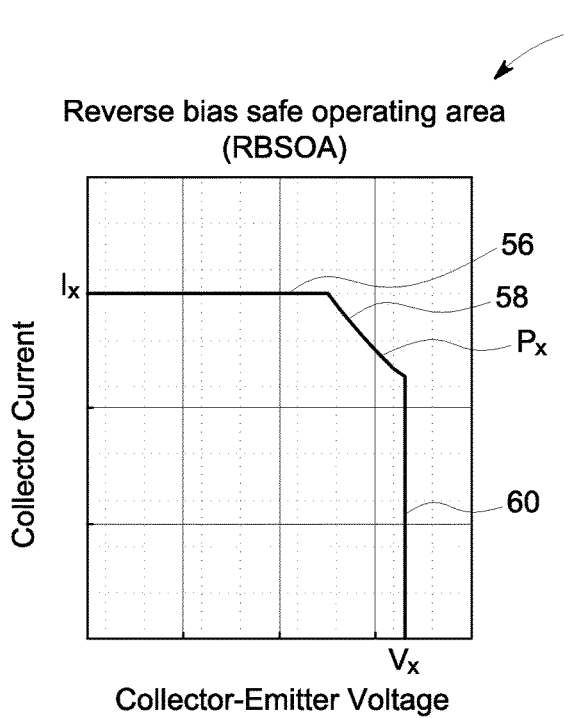
FIG. 3 is a graph illustrating an embodiment of a reverse bias safe operating area (RBSOA) of the IGBT of FIG. 1.
Figure 4:
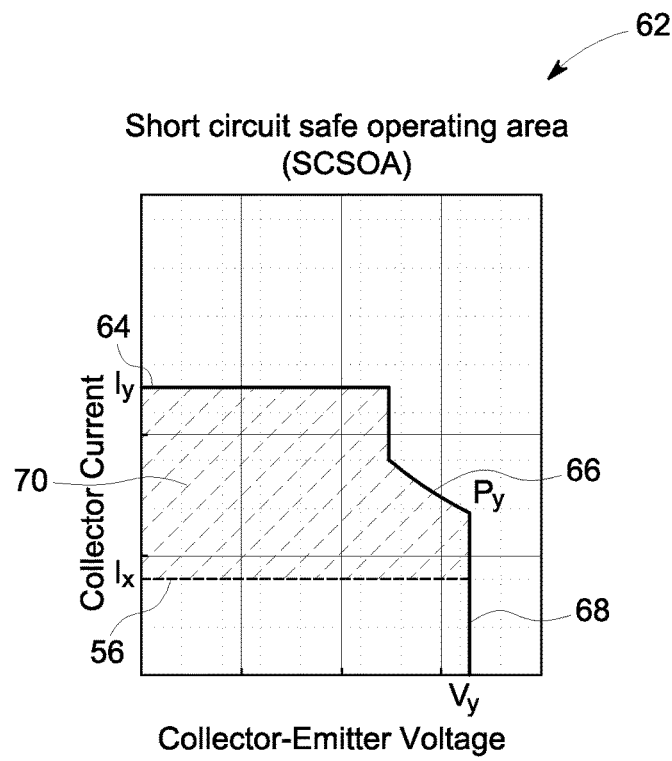
FIG. 4 is a graph illustrating an embodiment of a short circuit safe operating area (SCSOA) of the IGBT of FIG. 1.

The switch 20 may be associated with one or more safe operating areas that identify current limits for controlling (e.g., opening or closing) the switch 20. The safe operating areas of the switch 20 may be manufacturer-defined regions where the switch 20 is designed to operate. The safe operating areas may be based on properties of the switch 20, such as doping, material, components, size, or the like. Further, different safe operating areas may apply at different times, and the different safe operating areas may include different limits. For example, the switch 20 may have a reverse bias safe operating area (RBSOA) and a short circuit safe operating area (SCSOA) with one or more limits higher than the limits of the RBSOA. FIGS. 3 and 4 show safe operating areas that detail limits of current 27, power, and voltage of a switch 20 (e.g., between a collector and emitter of the switch). When the switch 20 was operating in the linear region before the opening of the switch 20, the RBSOA limits apply. When the switch 20 operates in the active region 44 while it is in closed state, the SCSOA limits (e.g., current limit 64) apply to the switch 20, but the RBSOA limits do not apply.

These limits may apply at different times because many switches 20, such as IGBTs, operate in the active region 44 when there are fewer carriers in a base of the IGBT than when in the linear region 42. In the linear region 42, the low-doped base of the IGBT is flooded with carriers to decrease the electrical resistance and accordingly the voltage drop in the base. The carriers are swept out when the IGBT is turned-off from the saturated state. The carrier sweep out leads to increased stress in the IGBT chip which is taken into account with the lower RBSOA limits to avoid destruction of the device. When the IGBT is turned-off from the de-saturated state or active region there are only few carriers in the base of the IGBT which leads to reduced stress compared to the turn-off from the saturated state and accordingly allows to apply the higher current and power limits from the SCSOA.

FIG. 3 is a graph 54 of an RBSOA that applies during normal turn off of a switch 20, such as an IGBT. The RBSOA of FIG. 3 may define limits, (e.g., when opening the switch 20) for voltage and current conditions where the switch 20 is expected to operate safely. An overcurrent may occur when the current 27 exceeds a current limit of the RBSOA. By exceeding the current limit, power and voltage limits may be exceeded when opening the switch 20 during the overcurrent. For example, the switch 20 may have an RBSOA that defines a current limit 56 (i.e. $I_X$), a power limit 58 (i.e. $P_X$), and/or a voltage limit 60 (i.e. $V_X$). For instance, some IGBTs may have voltage and current limits rated as 3.3 kV/1.5 kA with a maximum pulse current ($I_{CM}$) of 3 kA, twice the rated current of 1.5 kA. The current limit 56 may be equal to $I_{CM}$. If the current 27 through the switch 20 exceeds the current limit 56 (e.g., an overcurrent) when opening the switch 20, there is an increased likelihood of damage and/or break down of the switch 20, such as exceeding thermal limits and overheating or excessive stress on bond wires. Similarly, if the power limit 58 and/or voltage limit 60 is exceeded when opening the switch 20, then the switch 20 may break down from overheating or excessive field strength. In other words, the switch may break down from currents and/or voltages exceeding where the switch was designed to operate. Further, high current levels can also result in exceeding the voltage limit 60 and power limit 58. As such, the switch 20 cannot be safely turned off when the current 27 through the switch 20 exceeds the current limit 56. If an overcurrent occurs when the RBSOA applies and the switch 20 should be opened, it may be desirable if one or more characteristics of the switch 20 could be altered such that the SCSOA applies and the RBSOA does not apply.

The switch 20 may also be associated with an SCSOA that applies for a short time period (e.g., 5-20 μs or approximately 10 μs) during a short circuit condition (e.g., when the switch 20 operates in the active region 44 described in FIG. 2 above). FIG. 4 is a graph 62 of the SCSOA of the switch 20 that shows limits for various characteristics (e.g., current, voltage, power) during short circuit conditions for short periods. Similar to the RBSOA, the SCSOA may define a current limit 64 (i.e. $I_Y$), a power limit 66 (i.e. $P_Y$), and/or a voltage limit 68 (i.e. $V_Y$). As shown in FIG. 4, the RBSOA current limit 56 is lower than the SCSOA current limit 64 (e.g., $I_Y > I_X$). As such, the switch 20 may have an overcurrent that exceeds a current limit of the RBSOA (e.g., $I_X$) but does not exceed a current limit of the SCSOA (e.g., $I_Y$). For example, the region 70 of FIG. 4 denoted with dashed lines is associated with a switch 20 operating above the RBSOA current limit 56 and below the SCSOA current limit 64. During such periods, if the switch 20 were to open when the RBSOA current limit 56 applies, there is the increased likelihood of damage as described above. However, if the switch 20 opens when the SCSOA current limit 64 applies, the switch 20 may perform a controlled opening (e.g., controlled soft turn-off) to safely turn-off the switch 20, thereby protecting the switch 20 from an increased likelihood of damage. As such, transitioning (e.g., desaturating) the switch 20 to the active region 44 such that the SCSOA applies may be utilized to protect the switch 20 from opening while operating beyond the RBSOA. In this manner, the switch does not exceed any manufacturer defined limits for where the switch is designed to operate.

Figure 5:
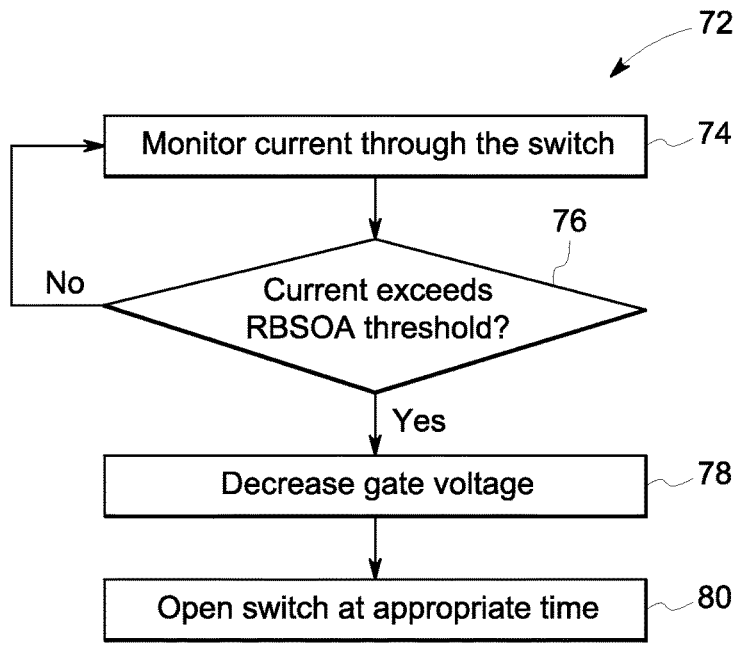
FIG. 5 is a flow diagram of an embodiment of a method in accordance with the present techniques.

In one embodiment, the gate drive unit 26 may be used in conjunction with the controller 28 to transition the switch 20 to the active region 44 to protect the switch 20 from opening when an overcurrent condition exceeding the RBSOA current limit 56 is present on the switch 20. FIG. 5 is a flow chart of a process 72 performed by the gate drive unit 26 and/or the controller 28 to protect the switch 20. The process 72 may be stored in the memory of the controller 28 and/or the gate drive unit 26 and executed as instructions by one or more processors. In another embodiment, the process 72 may be implemented within the gate driver and/or controller via the field programmable gate array (FPGA) and/or logic gates. The gate drive unit 26 and/or the controller 28 may be configured to monitor current through the switch 20 (block 74) to detect an overcurrent. The overcurrent, as described here, may indicate that a collector current 27 $I_C$ is exceeding the RBSOA current limit 56 and not exceeding (e.g., fall below) the short circuit current limit 64. In other words, the overcurrent may begin to occur when the switch 20 is operating in the linear region 42 while exceeding the RBSOA current limit 56 (e.g., an "in saturation" overcurrent).

The gate drive unit 26 may detect the overcurrent in a variety of ways. For example, the current 27 may be measured or estimated and/or the thermal properties may be monitored. In one embodiment, the overcurrent is detected on the gate drive unit 26 by monitoring the voltage drop across the switch 20 terminals (e.g., collector-emitter voltage 88 of FIG. 1) in the on-state ($V_{ceSat}$). The gate drive unit 26 may include one or more sensors for monitoring the voltage drop. In some cases, the voltage drop may also be temperature dependent. As such, an estimation or measurement of the switch 20 junction temperature may be utilized in detecting the overcurrent (e.g., in conjunction with the voltage drop). To detect the temperature, additional sensors may be included in the gate drive unit 26. In such cases, a temperature compensated measurement may be used to cancel any bias due to local temperatures. The current 27 may also be determined based on receiving signals indicating the voltage drop $V_{ceSat}$. As shown in FIG. 2, the current 27 can be inferred based on the voltage drop $V_{CE}$ and/or the temperature. For example, the current 27 may be determined by utilizing a look up table or a polynomial function that relates the voltage drop $V_{CE}$ to the current 27.

The controller 28 and/or the gate drive unit 26 may determine (block 76) whether the current 27 through the switch 20 exceeds the RBSOA threshold (e.g., an overcurrent has or is likely to occur). If no overcurrent is detected, the process 72 may begin again by continuing to monitor the current 27 through the switch 20 (block 74). If the controller 28 and/or the gate drive unit 26 determine that an overcurrent has or is likely to occur (e.g., via $V_{CE}$ and/or temperature described above), the gate drive unit 26 may decrease the gate voltage 34 (block 78) from a first preset voltage (e.g., $V_{GE3}$ of FIG. 2), associated with closing of the switch 20 (e.g., allows the switch to operate in a linear region), to a second preset voltage (e.g., $V_{GE2}$ of FIG. 2). The second voltage may be based on ensuring that the switch 20 operates in the active region (i.e., short circuit condition) when the current 27 exceeds the RBSOA current limit 56, thereby causing the RBSOA to no longer apply. The second voltage may be lower than the first voltage and allow the switch 20 to operate in the active region 44 associated with different limits (greater) than the RBSOA limits. In some embodiments, decreasing the gate voltage 34 forces the switch 20 to desaturate and transition from operating in the linear region 42 to operating in the active region 44. When the gate voltage 34 is decreased to the second voltage, the switch 20 transitions to desaturation. That is, the second voltage can ensure that the switch 20 operates in the active region 44 when the current 27 exceeds the RBSOA current limit 56. For example, in FIG. 2, if the RBSOA current limit 56 is larger or equal to $I_2$ and the second voltage is $V_{GE2}$, applying the second voltage as the gate voltage 34 would ensure the desaturation of the switch 20, which is equal to the condition in a short circuit.

The gate drive unit 26 may then open the switch 20 (block 80) at an appropriate time (e.g., perform a controlled soft turn-off when the switch is in the short circuit condition). The stored carriers in the base of the IGBT may increase the stress at turn-off from the saturated state and may also limit the controllability of the turn-off by the gate drive unit. If the switch 20 is desaturated and in the active region the gate drive unit can reduce the current 27 in a controlled way to zero by applying a defined falling gate voltage slope. In that way an exceeding of the power and voltage limits of the SCSOA can be prevented. For an overcurrent turn-off from the saturated state it may be difficult or impossible to prevent exceeding of the power and voltage limits of the RBSOA because of the limited controllability caused by the stored carriers.

Figure 6A:
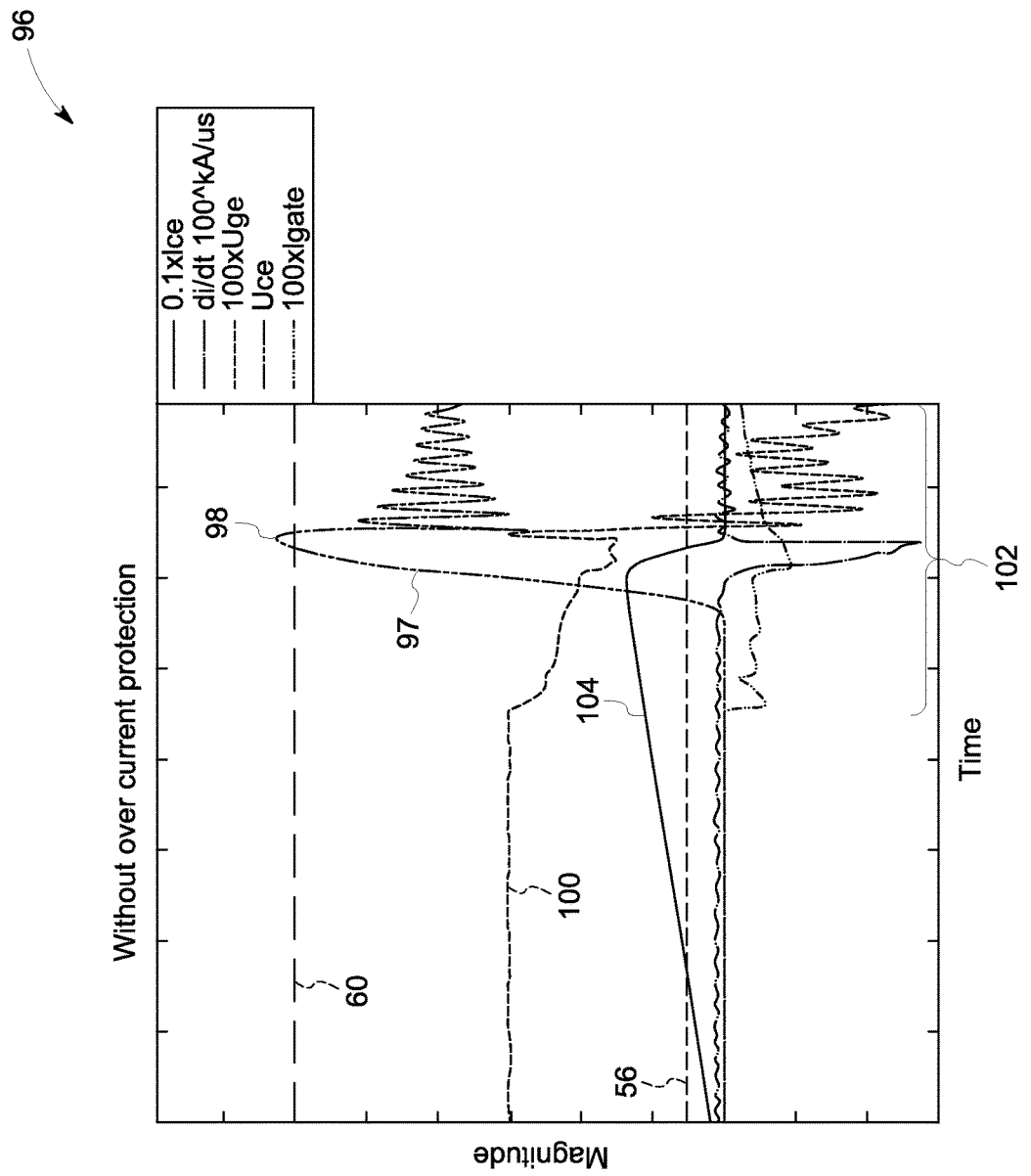
FIG. 6A is a graph illustrating an embodiment of an operation of the IGBT without overcurrent protection.

FIG. 6A is a graph 96 of an example of a turn off for a gate drive unit and switch without overcurrent protections. As shown in the graph 96, the current 27 from the first terminal 29 to the second terminal 31 is shown as signal 104. Further, the graph 96 includes a signal 97 indicating the voltage from the first terminal 29 to the second terminal 31 across the switch 20. Signal 100 indicates the gate voltage 34 of the switch 20. In FIG. 6A, the current signal 104 exceeds the RBSOA current limit 56. During this overcurrent condition, the switch 20 performs the controlled soft turn off 102 without undergoing desaturation. As a consequence, the voltage signal 104 shows the voltage across the switch 20 exceeding the RBSOA voltage limit 60 at the voltage spike 98 when turning off the overcurrent and overcurrent protections are not used. This may be due to the fact that $V_{GE}$ 100 is not reduced during an overcurrent condition 104 prior to performing the switch 20 turn off 102.

Figure 6B:
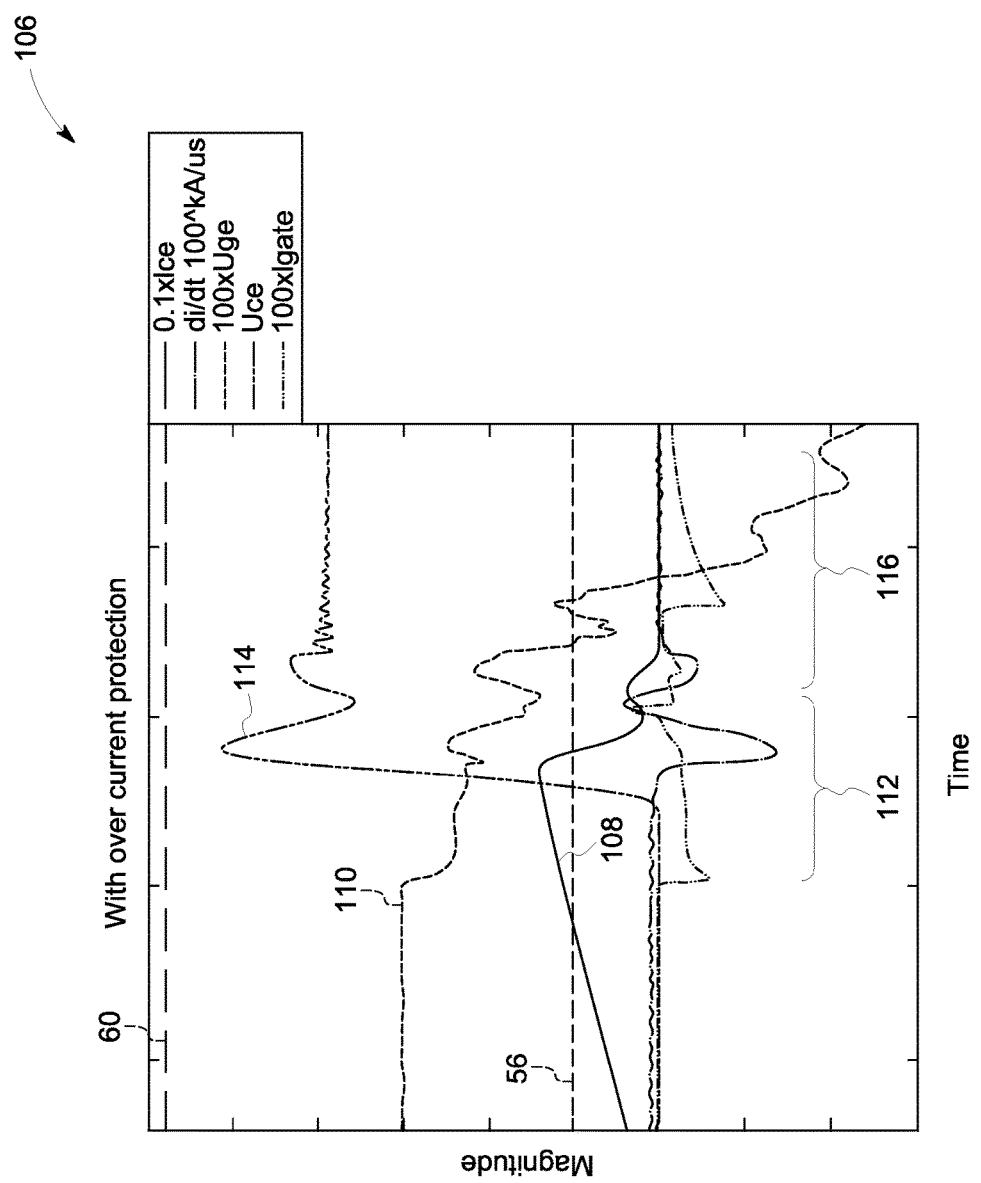
FIG. 6B is a graph illustrating an embodiment of an operation of the IGBT with overcurrent protection.

In contrast, FIG. 6B is a graph 106 of an example of a turn off for the gate drive unit 26 and switch 20 with overcurrent protections. FIG. 6B may be scaled with different current and/or voltage magnitudes than the current and/or voltage magnitudes of FIG. 6A. For example, the same RBSOA current limit 56 is shown in both figures to reflect the difference of scaling. The graph 106 includes a current signal 108 and voltage signal 114 from the first terminal 29 to the second terminal 31 of the switch 20. Further, the graph 106 includes a gate voltage signal 110. When the current signal 108 exceeds the RBSOA current limit 56, an overcurrent condition occurs. In this case, the gate driver is configured to reduce the gate voltage ($V_{GE}$) signal 110 during a desaturation phase 112. After the desaturation phase 112, the switch 20 can perform the controlled soft turn off 116 to protect the switch 20 from exceeding the voltage limit of the switch 20 which is typically the same in RBSOA and SCSOA. The soft turn off 116 may include opening the switch 20 at a slower rate than a typical opening of the switch 20 when there is no overcurrent. By using a soft turn-off with a slower opening of the switch 20, a smaller change in voltage across the switch 20 occurs to prevent an overvoltage beyond the capabilities of the switch.

In the preceding specification, various embodiments have been described with reference to the accompanying drawings. It will, however, be evident that various modifications and changes may be made thereto, and additional embodiments may be implemented, without departing from the broader scope of the disclosure as set forth in the claims that follow. The specification and drawings are accordingly to be regarded in an illustrative rather than restrictive sense.

At this point, it should be noted that the power generation device and methods described herein may be employed in stationary or in mobile applications. With regard to stationary applications, a suitable system may include power generation. Suitable power generation systems may include fuel-engine driven systems, wind power systems, solar systems, hydro-electric power systems, and the like. Suitable mobile applications may include vehicles and portable devices. Vehicles may include passenger vehicles, commercial vehicles, locomotives, off-highway and mining vehicles, agricultural vehicles, marine vessels, and aircraft.

It should also be appreciated that the power generation device and methods described herein may involve the processing of input data and the generation of output data to some extent. This input data processing and output data generation may be implemented in hardware or software. For example, specific electronic components may be employed in similar or related circuitry associated with providing improved power generation as described above. If such is the case, it is within the scope of the present disclosure that such instructions may be stored on one or more processor readable storage media, or transmitted to one or more processors.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method, comprising:
   detecting current from a first terminal of the switch to a second terminal of the switch, wherein the current exceeds a current limit for a linear region of the switch;
   controlling a gate voltage of the switch from a first voltage to a second voltage, wherein the second voltage is configured to enable the switch to operate in an active region of the switch; and
   opening the switch when the switch is operating in the active region, wherein the second voltage is based on ensuring that the switch transitions to operate in a short circuit safe operating area (SCSOA) when the current exceeds the current limit of a reverse bias safe operating area (RBSOA) of the linear region.

2. The method of claim 1, wherein the switch is configured to transition to desaturation when the gate voltage is decreased to the second voltage.

3. The method of claim 1, wherein the RBSOA comprises conditions of voltage, current, or any combination thereof, that the switch is designed to tolerate.

4. The method of claim 1, wherein the switch is an insulated-gate bipolar transistors IGBT.

5. The method of claim 1, wherein controlling the gate voltage comprises decreasing the gate voltage to cause the switch to operate in the active region.

6. The method of claim 1, wherein the overcurrent does not exceed a current limit of a short circuit safe operating area (SCSOA).

7. The method of claim 1, wherein opening the switch using the second voltage as the gate voltage reduces a voltage overshoot received by the switch by limiting the current flowing through the switch from the first terminal to the second terminal.

8. A system, comprising:
   a gate drive unit configured to:
      detect current from a first terminal of a switch to a second terminal of the switch, wherein the current exceeds a current limit for a linear region of the switch;
      control a gate voltage of the switch from a first voltage to a second voltage, wherein the second voltage is configured to enable the switch to operate in an active region of the switch; and open the switch when the switch is operating in active region, wherein opening the switch comprises a controlled soft turn off of the switch.

9. The system of claim 8, wherein the switch is an insulated-gate bipolar transistor (IGBT).

10. The system of claim 9, wherein the gate drive unit is configured to detect the current based on a voltage drop across the first terminal and the second terminal of the switch.

11. The system of claim 8, wherein the controlled soft turn off comprises opening the switch at a slower rate than the switch opens when the current is within the current limit.

12. The system of claim 8, wherein the first voltage is configured to cause the switch to operate in the linear region.

13. The system of claim 12, wherein decreasing the gate voltage is configured to cause the switch to desaturate from operating in the linear region to operating in the active region.

14. The system of claim 8, wherein the second gate voltage is configured to protect the switch from a high inductance failure that exceeds an inductance that is higher than a commutation loop inductance.

15. A system, comprising:
a switch;
a controller configured to transmit one or more drive signals to the switch, wherein the drive signals are configured to control the switch; and
a gate drive unit configured to provide a gate voltage, a gate current, or a combination thereof for controlling the switch based on the drive signals, wherein the gate drive unit is configured to:
detect current from a first terminal of the switch to a second terminal of the switch, wherein the current exceeds a current limit for a linear region of the switch, wherein the current is based on a voltage drop across terminals of the switch;
compensate for temperature dependence of the voltage drop with a measured or estimated temperature of the switch;
control a gate voltage of the switch from a first voltage to a second voltage, wherein the second voltage is configured to enable the switch to operate in an active region of the switch; and
open the switch when the switch is operating in the active region.

16. The system of claim 15, wherein the gate drive unit is configured to determine the voltage drop by utilizing a look up table, wherein the look up table provides current based on the voltage drop and temperature inputs.

17. A method, comprising:
detecting current from a first terminal of the switch to a second terminal of the switch, wherein the current exceeds a current limit for a linear region of the switch;
controlling a gate voltage of the switch from a first voltage to a second voltage, wherein the second voltage is configured to enable the switch to operate in an active region of the switch; and
opening the switch when the switch is operating in the active region, wherein the overcurrent does not exceed a current limit of a short circuit safe operating area (SCSOA).

18. A system, comprising:
a switch;
a controller configured to transmit one or more drive signals to the switch, wherein the drive signals are configured to control the switch; and
a gate drive unit configured to provide a gate voltage, a gate current, or a combination thereof for controlling the switch based on the drive signals, wherein the gate drive unit is configured to:
detect current from a first terminal of the switch to a second terminal of the switch, wherein the current exceeds a current limit for a linear region of the switch, wherein the current is based on a voltage drop across terminals of the switch;
determine the voltage drop by utilizing a look up table, wherein the look up table provides current based on the voltage drop and temperature inputs;
control a gate voltage of the switch from a first voltage to a second voltage, wherein the second voltage is configured to enable the switch to operate in an active region of the switch; and
open the switch when the switch is operating in the active region.

* * * * *